Jan. 17, 1967 R. E. NORTON 3,298,873

THERMOELECTRIC DEVICE HAVING A RIGID BASE STRUCTURE

Filed Jan. 3, 1961

INVENTOR.

ROBERT E. NORTON

BY

Carpenter, Abbott, Coulter & Kinney

ATTORNEYS

United States Patent Office
3,298,873
Patented Jan. 17, 1967

3,298,873
THERMOELECTRIC DEVICE HAVING A RIGID BASE STRUCTURE

Robert E. Norton, Minneapolis, Minn., assignor to Minnesota Mining and Manufacturing Company, St. Paul, Minn., a corporation of Delaware Filed Jan. 3, 1961, Ser. No. 80,418
10 Claims. (Cl. 136—208)

This invention relates to improvements in thermoelectric devices.

The development of efficient thermoelectric devices dictates the use of relatively new semiconductor materials which are low in physical strength and extremely frangible. High efficiency further requires optimum heat flow to and from the thermojunctions of such devices.

It is a general object of the present invention to provide an improved thermoelectric device utilizing frangible semiconductor thermoelements, the structure of said device being arranged in a novel manner to prevent said thermoelements from being exposed to any substantial stresses tending to fracture the same.

Another object of the invention is to provide an improved thermoelectric device of the aforementioned character having a plurality of heat dissipating fins which are arranged to form a rigid base structure for the device, optimum dissipation of heat from the device through said fins being afforded by a novel arrangement wherein each of said fins also functions as a thermojunction member.

A further object of the invention is to provide an improved device of the class described which is efficient in operation, compact, and well adapted to mass production fabrication techniques, the structure thereof being modular, such that the device can have embodied therein any desired number of thermocouples, permitting the capacity of the device to be readily matched to the requirements of a particular application.

Still another object of the invention is to provide a thermoelectric device, the structure of which is well adapted for either power generation or heat pumping.

Other and further objects and advantages of the invention will become apparent as the description proceeds, reference being had to the drawings accompanying and forming a part of this specification, in which.

Figure 1:
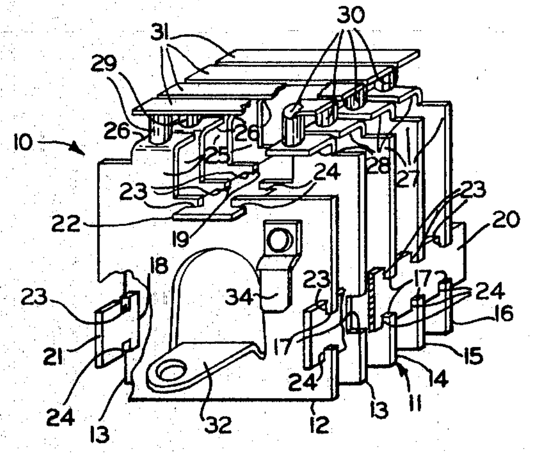
FIGURE 1 is a perspective view of one form of thermoelectric device constructed in accordance with the invention, parts being broken away.
Figures 2, 4:
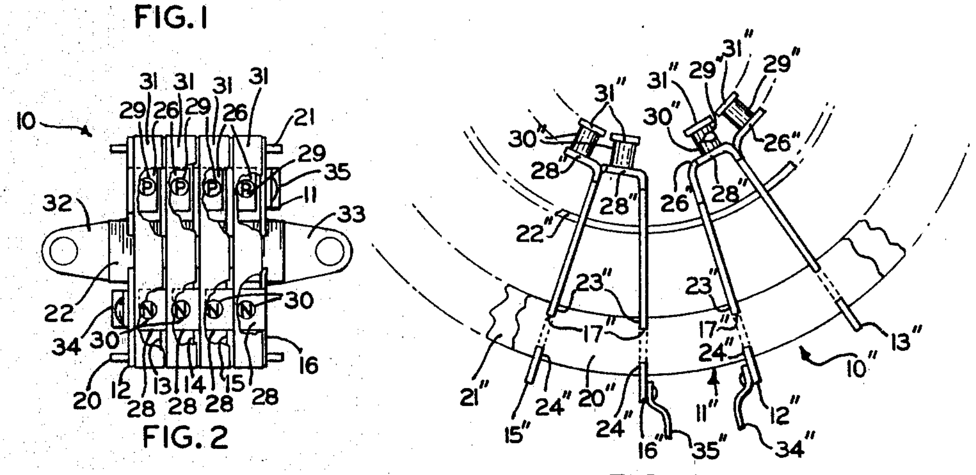
FIGURE 2 is a plan view of the device shown in FIGURE 1, parts being broken away.
FIGURE 4 is a fragmentary plan view of an annular thermoelectric device constructed in accordance with the invention.

Referring more particularly to FIGURES 1 and 2 of the drawing, the thermoelectric device illustrated therein is indicated generally by the numeral 10 and comprises a rigid base structure 11 formed of a plurality of thermojunction and heat transfer plates 12, 13, 14, 15 and 16 of electrically and thermally conductive material, for example copper. The plates 12 to 16 are alined in spaced parallel face-to-face relation and are rigidly held in said relation by any suitable electrically insulating means. In the device 10 illustrated in FIGURE 1, each of the plates 12 to 16 is formed in two opposite side edges with rectangular notches 17 and 18 respectively and in a third edge with a similar rectangular notch 19. The configuration of the notches 17, 18 and 19 is that shown best in the notch 17 in plate 13 in FIGURE 1. Disposed within the alined notches 17 of plates 12 to 16 is a rigid flat rectangular strip 20, for example of glass fiber reinforced plastic, and similar strips 21 and 22 are disposed in the alined notches 18 and 19 respectively of the plates 12 to 16.

The strips 20 to 22 have a width greater than the width of the notches 17 to 19. However, at each of the plates 12 to 16 said strips are formed with a pair of opposing rectangular notches 23 and 24, best shown on the strip 21 in FIGURE 1, the notches 23 and 24 having a width to snugly receive the plates therein and having a depth to provide a strip width therebetween substantially to provide a snug fit between the opposite side edge surfaces of the associated plate notches 17, 18 or 19. In addition to the described snug fitting relation between the strips 20 to 22 and plates 12 to 16 respectively, the plates 12 to 16 are subjected to a staking operation at the margins of the notches 17 to 19 outwardly of said strips, said staking firmly clamping said strips within said notches and thereby forming the plates 12 to 16 and strips 20 to 22 into a rigid structure.

Each of the plates 12 to 15 is formed in its upper left hand corner, as viewed in FIGURE 1, with an upwardly extending portion 25 terminating in a flange or tab portion 26 which is bent at a right angle to the planes of said plates. The tab portions 26 all project in the same direction and the upper surfaces thereof are coplanar. Each of the plates 13 to 16 is formed in its upper right hand corner, as viewed in FIGURE 1, with an upwardly projecting portion 27 terminating in a flange or tab portion 28 bent at a right angle to the planes of said plates. The tab portions 28 all project in the same direction and the upper surfaces thereof are coplanar with each other and preferably also with the upper surfaces of tab portions 26. It will be observed that the tab portions 26 and the tab portions 28 are bent in the opposite directions from the respective plates and that the tab portions 26 are alined in one row whereas the tab portions 28 are alined in another row parallel to the alinement of the tab portions 26.

Disposed on the upper surface of each of the tab portions 26 is a thermoelement 29 of one conductivity type, for example P-type. The thermoelements 29 may be cylindrical in shape and have their lower end surfaces electrically joined, as by soldering, to the upper surfaces of the respective tab portions 26 on which they are positioned. Disposed on each of the tab portions 28 is a thermoelement 30 of conductivity type opposite that of the thermoelements 29, for example N-type. The thermoelements 30 may also be cylindrical in shape and have their lower end surfaces electrically joined, as by soldering, to the upper surfaces of the respective tab portions 28 on which they are positioned.

It will be observed most clearly in FIGURE 2 that in the structure illustrated therein any given thermoelement 29 is transversely alined with a thermoelement 30 joined to and carried by the plate next adjacent that to which the given thermoelement 29 is joined. Electrically joining the aforementioned transversely alined thermoelements 29 and 30 are a plurality of thermojunction members 31 of thermally and electrically conductive material. Members 31 may take the form of spaced parallel strips or bars, for example of copper, joined, as by soldering, to the upper end surfaces of the respective thermoelements 29 and 30. The thermoelements 29 and 30 may be formed of the semi-metal or semiconductor materials disclosed in Fritts and Karrer U.S. Patent No. 2,896,005.

The end plates 12 and 16 have bracket members 32 and 33 pressed outwardly therefrom to provide means on the rigid base assembly 11 by which the thermoelectric device 10 may be mounted on a structure (not shown)

on which it will be used. Electrical connections to the device 10 can be made to lugs 34 and 35 riveted, and also preferably soldered, to the plates 12 and 16 respectively as shown.

It will be observed that the device 10 provides a generally helical current flow path therethrough from the lug 34 to the lug 35. When direct current is caused to flow through the device 10 in one direction, heat is absorbed through the thermojunction members 31, and is emitted through the fins or plates 12 to 16 which function as both thermojunction and heat transfer members. On the other hand, when current is caused to flow through the device 10 in the opposite direction, heat is absorbed through the plates 12 to 16 and is emitted through the members 31.

Figure 3:
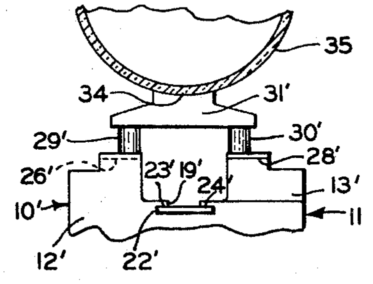
FIGURE 3 is a fragmentary end elevational view of another form of thermoelectric device constructed according to the invention and having thermojunction and heat transfer members formed with arcuate surfaces for contact with a complementary arcuate surface.

FIGURE 3 illustrates another form of thermoelectric device 10′ which may be identical to the device 10 in all respects except as hereinafter noted. In FIGURE 3 the parts of the device 10′, indicated by primed reference characters, correspond to the parts of the device 10 in FIGURES 1 and 2 indicated by the same reference characters unprimed. In the form of the invention shown in FIGURE 3, the thermojunction members 31′, instead of having coplanar upper surfaces like the thermojunction members 31, are each formed with an arcuate upper surface portion 34 adapted to be placed in heat transfer relation with a complemental arcuate surface, for example with the external surface of a glass tube 35 forming the envelope of a mercury vapor lamp. The device 10′ can thus be used to afford "spot" cooling for the reduction of the pressure within the tube 35 with resultant increase in the light output of the associated lamp, particularly in hot weather.

FIGURE 4 illustrates fragmentarily the thermoelectric device of the present invention in an annular configuration. In FIGURE 4 the rigid base structure 11″ is formed of a plurality of plates or thermojunction members in radial, rather than parallel, spaced relation, four of which are illustrated, i.e. 12″, 13″, 15″ and 16″. The aforementioned radial plates may be substantially identical with the plates 12, 13, 15 and 16 of FIGURE 1 except that the tab portions 26″ and 28″ thereof may extend at slightly obtuse angles therefrom. In the rigid base structure 11″ the annular insulating strips 20″, 21″ and 22″ are clamped within notches in the radial plates corresponding to the notches 17 to 19, said clamping engagement being substantially identical with that of the stips 20 to 22 in the notches 17 to 19. The thermoelements 29″ and 30″ extend radially and are in annular rows of like conductivity, type. Spaced axially extending thermojunction members or strips 31″ electrically join axially alined thermoelements 29″ and 30″ and define a generally cylindrical enclosure or chamber for receipt therein of an article, material or device to be heated or cooled by the device 10′. Electrical connections to the device 10″ may be made to the lugs 34″ and 35″ on the plates 12″ and 16″ respectively.

Figure 5:
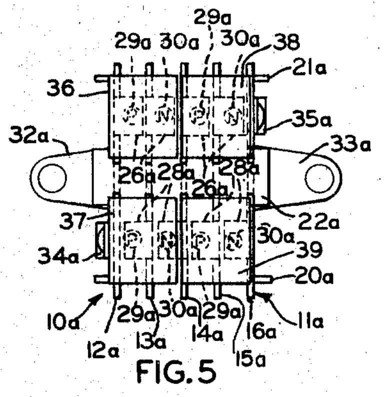
FIGURE 5 is a plan view of another form of thermoelectric device constructed in accordance with the invention.

FIGURE 5 illustrates a thermoelectric device 10*a* in which the parts indicated by reference characters having the subscript "*a*" may be identical with the parts of the device 10 indicated in FIGURES 1 and 2 by the same reference characters without a subscript. The device 10*a* has a rigid base structure 11*a* which may be identical with the base structure 11 of the device 10. It will be observed, however, that the thermoelements 29*a* and 30*a* are arranged in rows in which the N-type thermoelements 30*a* are alternated with the P-type thermoelements 29*a* and that the tab portions 28*a* of the plates 13*a* and 15*a* are electrically joined to P-type thermoelements 29*a* whereas the tab portions 26*a* of the plates 13*a* and 15*a* are electrically joined to N-type thermoelements 30*a*. Spaced rectangular thermojunction members or plates 36, 37, 38 and 39, which preferably have coplanar upper surfaces, are electrically joined to the upper ends of pairs of adjacent thermoelements 29*a* and 30*a* as shown in FIGURE 4.

The structure of the device 10*a* is particularly well adapted for the use in power generation wherein the members 36 to 39 are subjected to relatively high temperatures. By virtue of the relatively short distance between the thermoelements joined by the individual members 36 to 39, the bending stress exerted on said thermoelements as a result of thermal expansion and contraction of said members 36 to 39 is reduced to a minimum. The device 10*a* is also well adapted for use as a heating or cooling device as well as a power generating device, and the same is true of the devices 10, 10′ and 10″.

Having thus described four embodiments of the invention, it is to be understood that the illustrated embodiments were selected to facilitate the disclosure of the invention rather than to limit the number of forms which it may assume. Various modifications, adaptations and alterations may be applied to the specific form shown to meet the requirements of practice, without in any manner departing from the spirit or scope of the present invention, and all of such modifications, adaptations and alterations are contemplated as may come within the scope of the appended claims.

What is claimed as the invention is:

1. A thermoelectric device comprising a plurality of similar electrically and thermally conductive thermojunction and heat transfer plates, said plates being provided at one edge thereof with transversely extending surface portions; an N-type and a P-type thermoelement, each having opposite end surfaces, electrically conductively joined to each of said plates with one thermoelement on each said surface portion by one of said opposite end surfaces of each thermoelement; means for rigidly securing said plates in electrically insulated spaced relation to provide a rigid base structure with said thermoelements arranged in two rows, each containing one of the thermoelements of each plate; a thermally and electrically conductive thermojunction and heat transfer member electrically conductively joined to the other of said end surfaces of each P-type thermoelement and to the other of said end surfaces of the N-type thermoelement of the next adjacent plate, such that said P and N-type thermoelements are connected in alternate series circuit relation through said thermojunction plates and members.

2. A thermoelectric device was defined in claim 1 wherein said rows of thermoelements form conecntric circles.

3. A thermoelectric device as defined in claim 1 wherein said heat transfer members are flat platelets lying in a plane.

4. A thermoelectric device according to claim 1 in which said plates are disposed in alined generally parallel face-to-face relation.

5. A thermoelectric device according to claim 1 which is annular in shape and in which said thermoelements and said plates extend in radial directions.

6. A thermoelectric device comprising a rigid base structure comprising a plurality of similar electrically and thermally conductive thermojunction and heat transfer plates, and means for rigidly securing said plates in electrically insulated spaced relation, said plates each being provided at one edge thereof with flange portions affording a pair of transversely extending surface portions, a plurality of spaced P-type thermoelements having opposite end surfaces and each having one end surface electrically conductively joined to one of said transversely extending surface portions, a plurality of spaced N-type thermoelements having opposite end surfaces and each having one end surface electrically conductively joined to the other of said pair of transversely extending surface portions, to join one thermoelement to each of said transversely extending surface portions, and a plurality of spaced thermally and electrically conductive thermojunction and heat transfer members, each of said members being electrically conductively joined to the other of said end surfaces of a P-type thermoelement and to the other of said end surfaces of an N-type thermoelement joined to a plate next-adjacent that to which said last-mentioned P-type thermoelement is joined such that said P and N-type thermoelements are connected in alternate series circuit relation through said thermojunction plates and members.

7. A thermoelectric device comprising a rigid base structure comprising a plurality of similar electrically and thermally conductive thermojunction and heat transfer plates, and means for rigidly securing said plates in electrically insulated spaced relation, said plates each being provided at one edge thereof with oppositely directed tabs extending generally normal thereto and affording a pair of transversely extending surface portions, a plurality of spaced P-type thermoelements having opposite end surfaces and each having one end surface electrically conductively joined to one of said transversely extending surface portions, a plurality of spaced N-type thermoelements having opposite end surfaces and each having one end surface electrically conductively joined to the other of said pair of transversely extending surface portions, to join one thermoelement to each of said transversely extending surface portions, and a plurality of spaced thermally and electrically conductive thermojunction and heat transfer members, each of said members being electrically conductively joined to the other of said end surfaces of a P-type thermoelement and to the other of said end surfaces of an N-type thermoelement joined to a plate next-adjacent that to which said last-mentioned P-type thermoelement is joined such that said P and N-type thermoelements are connected in alternate series circuit relation through said thermojunction plates and members.

8. A thermoelectric device comprising a rigid base structure comprising a plurality of similar electrically and thermally conductive thermojunction and heat transfer plates, and means for rigidly securing said plates in electrically insulated spaced relation, and mounting bracket means fixed to said rigid base structure and adapted for securement of said device to a support, said plates each being provided at one edge thereof with means affording a pair of transversely extending surface portions, a plurality of spaced P-type thermoelements having opposite end surfaces and each having one end surface electrically conductively joined to one of said transversely extending surface portions, a plurality of spaced N-type thermoelements having opposite end surfaces and each having one end surface electrically conductively joined to the other of said pair of transversely extending surface portions, to join one thermoelement to each of said transversely extending surface portions, and a plurality of spaced thermally and electrically conductive thermojunction and heat transfer members, each of said members being electrically conductively joined to the other of said end surfaces of a P-type thermoelement and to the other of said end surfaces of an N-type thermoelement joined to a plate next-adjacent that to which said last-mentioned P-type thermoelement is joined such that said P and N-type thermoelements are connected in alternate series circuit relation through said thermojunction plates and members.

9. A thermoelectric device comprising a rigid base structure comprising a plurality of similar electrically and thermally conductive thermojunction and heat transfer plates, and means for rigidly securing said plates in electrically insulated face-to-face spaced relation, said plates each being provided at one edge thereof with means affording a pair of transversely extending surface portions, a first row of spaced P-type thermoelements having opposite end surfaces and each having one end surface electrically conductively joined to one of said transversely extending surface portions of a separate one of said plates to join one P-type thermoelement to each plate, a second row of spaced N-type thermoelements having opposite end surfaces and each having one end surface electrically conductively joined to the other of said pair of transversely extending surface portions of a separate one of said plates to join one N-type thermoelement to each plate, and a plurality of spaced thermally and electrically conductive thermojunction and heat transfer members extending transversely of said rows, each of said members being electrically conductively joined to the other of said end surfaces of a P-type thermoelement and to the other of said end surfaces of the N-type thermoelement joined to a plate next-adjacent that to which said last-mentioned P-type thermoelement is joined such that said P and N-type thermoelements are connected in alternate series circuit relation through said thermojunction plates and members.

10. A thermoelectric device comprising a rigid base structure comprising a plurality of similar electrically and thermally conductive thermojunction and heat transfer plates, and means for rigidly securing said plates in electrically insulated spaced relation, said plates each being provided at one edge thereof with means affording a pair of transversely extending surface portions, a first row of spaced alternately arranged P-type and N-type thermoelements having opposite end surfaces and each having one end surface electrically conductively joined to one of said transversely extending surface portions, a second row of spaced alternately arranged P-type and N-type thermoelements having opposite end surfaces and each having one end surface electrically conductively joined to one of said transversely extending surface portions, to join one thermoelement to each transversely extending surface portion, and a plurality of spaced thermally and electrically conductive thermojunction and heat transfer members extending in the direction of said rows, each of said members being electrically conductively joined to the other of said end surfaces of a P-type thermoelement and to the other of said end surfaces of an N-type thermoelement joined to a plate next-adjacent that to which said last-mentioned P-type thermoelement is joined such that said P and N-type thermoelements are connected in alternate series circuit relation through said thremojunction plates and members.

References Cited by the Examiner

UNITED STATES PATENTS

| | | | |
|---|---|---|---|
| 773,838 | 11/1904 | Wightman | 136—4.2 |
| 2,872,788 | 2/1959 | Lindenblad | 136—4.2 |
| 2,903,857 | 9/1959 | Lindenblad | 136—4.2 |
| 2,951,105 | 8/1960 | Busanovich | 136—4.2 |
| 2,959,925 | 11/1960 | Frantti et al. | 136—4.2 |
| 2,997,514 | 8/1961 | Roeder | 136—4.2 |
| 3,010,285 | 11/1961 | Penn | 62—3 |

FOREIGN PATENTS

| | | |
|---|---|---|
| 742,364 | 12/1932 | France. |
| 1,054,733 | 10/1953 | France. |
| 264,855 | 4/1928 | Great Britain. |

WINSTON A. DOUGLAS, *Primary Examiner.*

JOHN H. MACK, ALLEN B. CURTIS, *Examiners.*

J. BARNEY, A. M. BEKELMAN, *Assistant Examiners.*